United States Patent
Botula et al.

(10) Patent No.: US 8,131,225 B2
(45) Date of Patent: Mar. 6, 2012

(54) BIAS VOLTAGE GENERATION CIRCUIT FOR AN SOI RADIO FREQUENCY SWITCH

(75) Inventors: Alan B. Botula, Essex Junction, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 586 days.

(21) Appl. No.: 12/342,335

(22) Filed: Dec. 23, 2008

(65) Prior Publication Data

US 2010/0156511 A1    Jun. 24, 2010

(51) Int. Cl.
*H04B 1/44* (2006.01)

(52) U.S. Cl. .......... 455/78; 455/83; 455/127.1; 257/349

(58) Field of Classification Search .............. 455/78, 455/83, 127.1; 333/103–104
See application file for complete search history.

(56) References Cited

U.S. PATENT DOCUMENTS

| | | | |
|---|---|---|---|
| 6,108,527 A | 8/2000 | Urban et al. | |
| 6,562,666 B1 | 5/2003 | Park et al. | |
| 7,123,898 B2 | 10/2006 | Burgener et al. | |
| 7,205,190 B2 | 4/2007 | Okihara | |
| 7,479,418 B2 * | 1/2009 | Cai et al. | 438/154 |
| 7,772,648 B1 * | 8/2010 | Ivanov et al. | 257/349 |
| 2005/0017789 A1 * | 1/2005 | Burgener et al. | 327/436 |
| 2005/0133868 A1 * | 6/2005 | Su et al. | 257/355 |
| 2005/0179093 A1 * | 8/2005 | Morris | 257/371 |
| 2007/0018247 A1 * | 1/2007 | Brindle et al. | 257/347 |
| 2008/0059930 A1 * | 3/2008 | Abadeer et al. | 716/5 |

* cited by examiner

*Primary Examiner* — Khai M Nguyen
(74) *Attorney, Agent, or Firm* — Scully, Scott, Murphy & Presser, P.C.; Anthony J. Canale

(57) ABSTRACT

A radio frequency (RF) switch located on a semiconductor-on-insulator (SOI) substrate includes at least one electrically biased region in a bottom semiconductor layer. The RF switch receives an RF signal from a power amplifier and transmits the RF signal to an antenna. The electrically biased region may be biased to eliminate or reduce accumulation region, to stabilize a depletion region, and/or to prevent formation of an inversion region in the bottom semiconductor layer, thereby reducing parasitic coupling and harmonic generation due to the RF signal. A voltage divider circuit and a rectifier circuit generate at least one bias voltage of which the magnitude varies with the magnitude of the RF signal. The at least one bias voltage is applied to the at least one electrically biased region to maintain proper biasing of the bottom semiconductor layer to minimize parasitic coupling, signal loss, and harmonic generation.

25 Claims, 7 Drawing Sheets

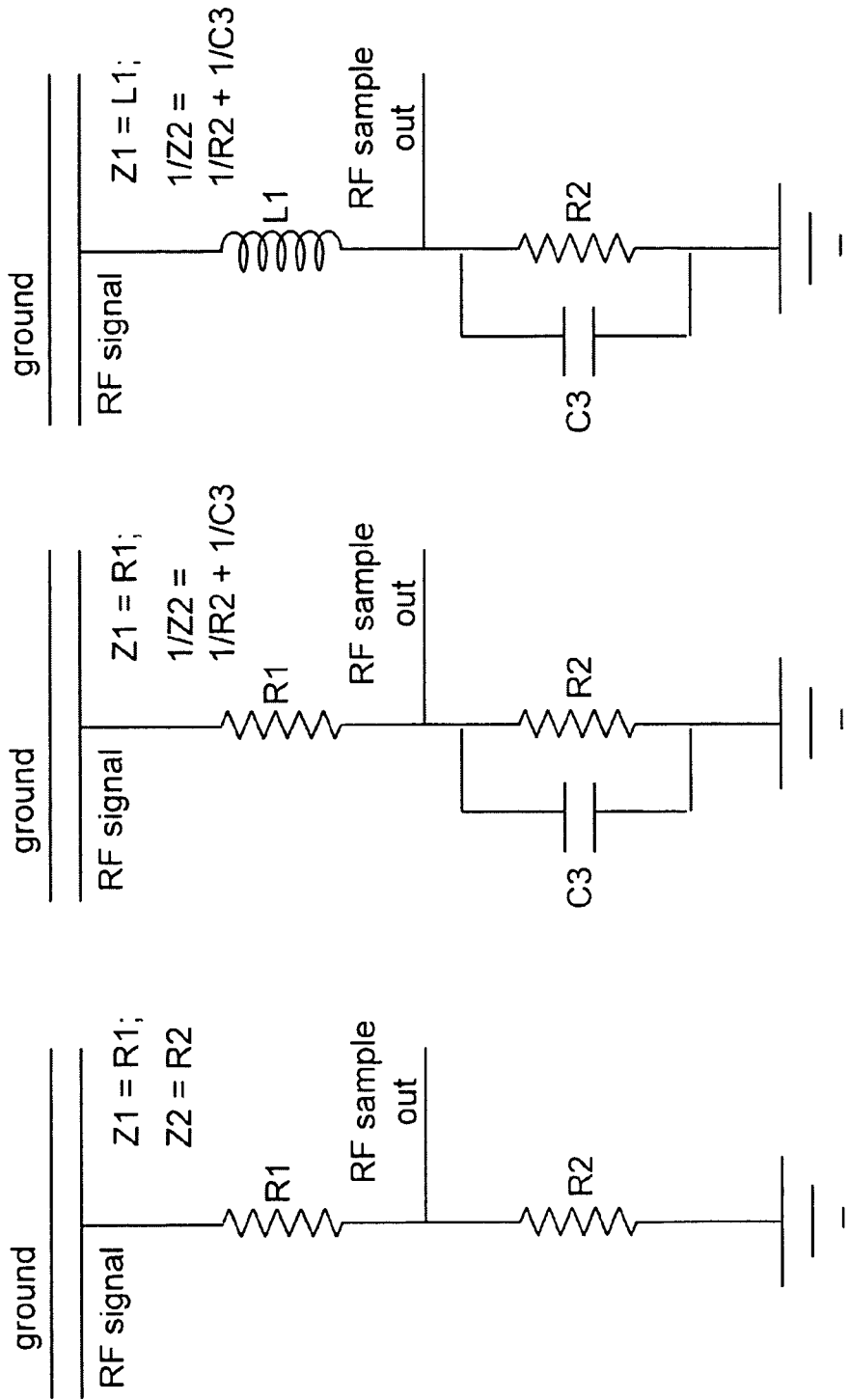

BIAS VOLTAGE GENERATION CIRCUIT FOR AN SOI RADIO FREQUENCY SWITCH

FIELD OF THE INVENTION

The present invention relates to semiconductor circuits, and particularly to a semiconductor circuit including a radio frequency switch on a semiconductor-on-insulator (SOI) substrate and a bias voltage generation circuit for the radio frequency switch, and methods of operating the same.

BACKGROUND OF THE INVENTION

Semiconductor devices such as field effect transistors are employed as a switching device for radio frequency (RF) signals in analog and RF applications. Semiconductor-on-insulator (SOI) substrates are typically employed for such applications since parasitic coupling between devices through the substrate is reduced due to the low dielectric constant of a buried insulator layer. For example, the dielectric constant of silicon, which comprises the entirety of the substrate of a bulk silicon substrate, is about 11.9 in gigahertz ranges. In contrast, the dielectric constant of silicon oxide, which isolates a top semiconductor layer containing devices from a handle substrate, is about 3.9. By providing the buried insulator layer, which has a dielectric constant less than the dielectric constant of a semiconductor material in a bulk substrate, the SOI substrate reduces capacitive coupling between an individual semiconductor device and the substrate, and consequently, reduces secondary capacitive coupling between semiconductor devices through the substrate.

However, even with the use of an SOI substrate, the secondary capacitive coupling of electrical signals between semiconductor devices is significant due to the high frequency range employed in the radio frequency applications, which may be, for example, from about 900 MHz to about 1.8 GHz, and may include even higher frequency ranges. This is because the capacitive coupling between electrical components increases linearly with frequency.

For a radio frequency (RF) switch formed on an SOI substrate, the semiconductor devices comprising the RF switch and the signal processing units in a top semiconductor layer are capacitively coupled through a buried insulator layer to a bottom semiconductor layer. Even if the semiconductor devices in the top semiconductor layer employ a power supply voltage from about 3 V to about 9V, the transient signals and signal reflections in an antenna circuitry may increase the actual voltage in the top semiconductor layer up to about 30V. Such voltage conditions induce a significant capacitive coupling between the semiconductor devices subjected to such high voltage signals and an induced charge layer within an upper portion of the bottom semiconductor layer, which changes in thickness and charge polarity at the frequency of the RF signal in the semiconductor devices in the top semiconductor layer. The induced charge layer capacitively couples with other semiconductor devices in the top semiconductor layer including the semiconductor devices that an RF switch is supposed to isolate electrically. The spurious capacitive coupling between the induced charge layer in the bottom semiconductor layer and the other semiconductor devices provide a secondary capacitive coupling, which is a parasitic coupling that reduces the effectiveness of the RF switch. In this case, the RF signal is applied to the other semiconductor devices through the secondary capacitive coupling although the RF switch is turned off.

Referring to FIG. 1, a prior art radio frequency switch comprises a set of serially connected field effect transistors formed on a semiconductor-on-insulator (SOI) substrate 8. The SOI substrate 8 comprises a bottom semiconductor layer 10, a buried insulator layer 20, and a top semiconductor layer 30. The top semiconductor layer 30 includes top semiconductor portions 32 and shallow trench isolation structures 33 which provide electrical isolation between adjacent top semiconductor portions 32. Each field effect transistor comprises a gate electrode 42, a gate dielectric 40, a gate spacer 44, and source and drain regions (not shown) formed in a top semiconductor portion 32. The field effect transistors are serially connected via a set of contact vias 88 and metal lines 98. The contact vias 88 are embedded in a middle-of-line (MOL) dielectric layer 80, and the metal lines 98 are formed in a interconnect-level dielectric layer 90.

A high voltage signal, which may have a voltage swing up to about +/−30V induces a charge layer 11 in an upper portion of the bottom semiconductor layer 10 through a capacitive coupling, which is schematically indicated by a set of capacitors 22 between the semiconductor devices and the bottom semiconductor layer 10. The induced charge layer 11 contains positive charges while the voltage in the semiconductor devices in the top semiconductor layer 30 have a negative voltage, and negative charges while the voltage in the semiconductor devices in the top semiconductor layer 30 have a positive voltage. The high frequency of the RF signal in the semiconductor devices induces changes in the thickness of the induced charge layer 11 and the polarity of the charges in the induced charge layer at the same frequency as the frequency of the RF signal.

The time required to dissipate the charges in the induced charge layer 11 is characterized by an RC time constant, which is determined by the capacitance of the set of capacitors 22 and a substrate resistance, in the accumulation mode. The substrate resistance is the resistance between the induced charge layer 11 and electrical ground, which is typically provided by an edge seal at the boundary of a semiconductor chip. The substrate resistance is symbolically represented by a resistor 12 between the induced charge layer 11 and electrical ground. Such substrate resistance may be extremely high because the bottom semiconductor layer 10 typically employs a high resistivity semiconductor material having a resistivity of about 5 Ohms-cm to minimize eddy current. Further, the lateral distance to an edge seam may be up to about half the lateral dimension of the semiconductor chip, e.g., on the order of about 1 cm. In the inversion mode, the times required to generate and dissipate the induced charge are characterized by the generation and recombination rates in the bulk semiconductor.

Such large substrate resistance 12 increases the RC time constant for the dissipation of the charge in the induced charge layer 11 beyond the time scale of the period of the RF signal. Since dissipation of the charge in the induced charge layer 11 is effectively barred due to a long RC time constant, the capacitive coupling between the semiconductor devices in the top semiconductor layer 30 and the bottom semiconductor layer 10 results in loss of signal even during the off-state of the RF switch. Further, spurious RF signal is introduced into semiconductor devices that are disconnected by the RF switch from the RF signal through the secondary capacitive coupling of the semiconductor devices through the induced charge layer 11.

During one half of each frequency cycle of the RF signal, the top portion of the bottom semiconductor layer 10 directly underneath the buried insulator layer 20 is in an accumulation condition, in which charge carriers in the bottom semiconductor layer 10 accumulate near the bottom surface of the buried insulator layer 20. Specifically, when the conductivity type of the bottom semiconductor layer 10 is p-type and the voltage of the top semiconductor portions 32 is negative relative to the voltage at the bottom semiconductor layer 10, or when the conductivity type of the bottom semiconductor layer 10 is n-type and the voltage of the top semiconductor portions 32 is positive relative to the voltage at the bottom semiconductor layer 10, the majority charge carriers, i.e., holes if the bottom semiconductor layer 10 is p-type or electrons if the bottom semiconductor layer 10 is n-type, accumulate in the upper portion of the bottom semiconductor layer 10 to form the induced charge layer 11. The thickness of the induced charge layer 11 is then proportional to the square root of the voltage differential between the top semiconductor portions 32 and the bottom semiconductor layer 10. The change in the thickness of the induced charge layer 11 as well as the amount of charge in the induced charge layer generates additional harmonic signals of the RF frequency, which is coupled to semiconductor devices in a top semiconductor portion 32, thereby providing a spurious signal even when the RF switch is turned off.

Further, during the other half of each frequency cycle of the RF signal, the top portion of the bottom semiconductor layer 10 directly underneath the buried insulator layer 20 is in a depletion condition, in which majority charge carriers in the bottom semiconductor layer 10 are repelled from the bottom surface of the buried insulator layer 20. Specifically, when the conductivity type of the bottom semiconductor layer 10 is p-type and the voltage of the top semiconductor portions 32 is positive relative to the voltage at the bottom semiconductor layer 10, or when the conductivity type of the bottom semiconductor layer 10 is n-type and the voltage of the top semiconductor portions 32 is negative relative to the voltage at the bottom semiconductor layer 10, the majority charge carriers, i.e., holes if the bottom semiconductor layer 10 is p-type or electrons if the bottom semiconductor layer 10 is n-type, are repelled from the upper portion of the bottom semiconductor layer 10 to form the induced charge layer 11, which is depleted of the majority charges. Further, when magnitude of the voltage differential between the top semiconductor portions 32 and the bottom semiconductor layer 10 is sufficiently great, an inversion region including minority charges, i.e., electrons if the bottom semiconductor layer 10 is p-type or holes if the bottom semiconductor layer 10 is n-type, is formed within the induced charge layer 11. The thicknesses of the depletion zone and the quantity of inversion charge in the induced charge layer 11 depend on the magnitude of the voltage differential between the top semiconductor portions 32 and the bottom semiconductor layer 10. The change in the thickness of the induced charge layer 11 as well as the amount of charge in the induced charge layer generates additional harmonic signals of the RF frequency in this phase of the frequency cycle of the RF signal, which is coupled to semiconductor devices in a top semiconductor portion 32, thereby providing a spurious signal even when the RF switch is turned off.

In view of the above, there exists a need for a semiconductor circuit that enhances signal isolation and reduces eddy current and harmonic generation for a radio frequency switch in a semiconductor-on-insulator (SOI) substrate, and methods of operating the same.

SUMMARY OF THE INVENTION

To address the needs described above, the present invention provides a semiconductor circuit including a radio frequency (RF) switch on a semiconductor-on-insulator (SOI) substrate having at least one electrically biased region in a bottom semiconductor layer and a bias voltage generation circuit that generates a bias voltage from the radio frequency signal in the RF switch, and methods of operating the same.

In the present invention, a radio frequency (RF) switch located on a semiconductor-on-insulator (SOI) substrate includes at least one electrically biased region in a bottom semiconductor layer. The RF switch receives an RF signal from a power amplifier and transmits the RF signal to an antenna. The electrically biased region may be biased to eliminate or reduce accumulation region, to stabilize a depletion region, and/or to prevent formation of an inversion region in the bottom semiconductor layer, thereby reducing parasitic coupling and harmonic generation due to the RF signal. A voltage divider circuit taps the RF signal and provides a fraction of the RF signal as an input signal to a rectifier circuit. The rectifier circuit generates at least one bias voltage of which the magnitude varies with the magnitude of the RF signal. The at least one bias voltage is applied to the at least one electrically biased region to maintain proper biasing of the bottom semiconductor layer to minimize parasitic coupling, signal loss, and harmonic generation.

According to the present invention, a method of operating a semiconductor circuit is provided, which comprises:
providing a semiconductor circuit including:
a radio frequency (RF) switch including at least one field effect transistor located on a semiconductor-on-insulator (SOI) substrate;
a radio frequency (RF) signal line for transmitting a radio frequency (RF) signal, wherein the RF signal line is connected to the RF switch; and
a circuitry that generates at least one bias voltage from the RF signal; and
supplying the at least one bias voltage to a bottom semiconductor layer of the SOI substrate.

In one embodiment, the semiconductor circuit further comprises:
a voltage divider connected between the RF signal line and electrical ground; and
a rectification circuit connected to the voltage divider and generating the at least one bias voltage from the RF signal.

In another embodiment, the semiconductor circuit further comprises at least one bias voltage feed line that supplies the at least one bias voltage to the bottom semiconductor layer of the SOI substrate.

In even another embodiment, the semiconductor structure further comprises at least one conductive via resistively connected to the bottom semiconductor layer, and wherein the at least one bias voltage is provided to the bottom semiconductor layer through the at least one conductive via.

In yet another embodiment, the at least one bias voltage includes a positive bias voltage having a magnitude greater than a magnitude of a maximum positive swing of the RF signal within a period of the RF signal, and wherein the at least one bias voltage includes a negative bias voltage having a magnitude greater than a magnitude of a maximum negative swing of the RF signal within a period of the RF signal.

In still another embodiment, the semiconductor circuit further comprises a power amplifier which is connected to, and provides the RF signal to, the RF signal line.

In still yet another embodiment, the semiconductor circuit of claim 10, further comprises an antenna for transmitting the RF signal and another RF signal line connected to the RF switch and the antenna.

In a further embodiment, the voltage divider comprises a serial connection of a first set of at least one impedance element having a first impedance and a second set of at least one impedance element having a second impedance, wherein one end of the first set of at least one impedance element is directly connected to the RF signal line, and wherein one end of the second set of at least one impedance element is directly connected to electrical ground.

In an even further embodiment, the semiconductor circuit further comprises:
  at least one first doped semiconductor region embedded in the bottom semiconductor layer and having a p-type doping; and
  at least one second doped semiconductor region embedded in the bottom semiconductor layer and having an n-type doping.

In a yet further embodiment, the method further comprises:
  applying a negative bias voltage that the rectification circuit generates from the RF signal to the at least one first doped semiconductor region; and
  applying a positive bias voltage that the rectification circuit generates from the RF signal is applied to the at least one second doped semiconductor region.

In a still further embodiment, the method further comprises:
  suppressing formation of an accumulation region in which majority charge carriers accumulate in the bottom semiconductor layer with one of the negative bias voltage and the positive bias voltage; and
  suppressing formation of an inversion region in which minority charge carriers accumulate in the bottom semiconductor layer with the other of the negative bias voltage and the positive bias voltage.

In a still yet further embodiment, the method further comprises draining minority charge carriers in the bottom semiconductor layer through at least one conductive via resistively connected to the bottom semiconductor layer.

According to another aspect of the present invention, a semiconductor circuit is provided, which comprises:
  a radio frequency (RF) switch including at least one field effect transistor located on a semiconductor-on-insulator (SOI) substrate;
  a radio frequency (RF) signal line for transmitting a radio frequency (RF) signal, wherein the RF signal line is connected to the RF switch;
  a voltage divider connected between the RF signal line and electrical ground;
  a rectification circuit connected to the voltage divider and generating at least one bias voltage from the RF signal, wherein the at least one bias voltage varies with a time constant greater than a period of the RF signal; and
  at least one bias voltage feed line providing the at least one bias voltage to a bottom semiconductor layer of the SOI substrate.

In one embodiment, the semiconductor circuit further comprises at least one conductive via resistively connected to the bottom semiconductor layer, wherein the at least one bias voltage is provided to the bottom semiconductor layer through the at least one conductive via.

In another embodiment, the at least one bias voltage includes a positive bias voltage having a magnitude greater than a magnitude of a maximum positive swing of the RF signal within a period of the RF signal as induced in the substrate, and wherein the at least one bias voltage includes a negative bias voltage having a magnitude greater than a magnitude of a maximum negative swing of the RF signal within a period of the RF signal as induced in the substrate.

In yet another embodiment, the semiconductor circuit further comprises a power amplifier which is connected to, and provides the RF signal to, the RF signal line.

In still another embodiment, the semiconductor circuit further comprises:
  an antenna for transmitting the RF signal; and
  another RF signal line connected to the RF switch and the antenna.

In a further embodiment, the voltage divider comprises a serial connection of a first set of at least one impedance element having a first impedance and a second set of at least one impedance element having a second impedance, wherein one end of the first set of at least one impedance element is directly connected to the RF signal line, and wherein one end of the second set of at least one impedance element is directly connected to electrical ground, and wherein a common node between the first set and the second set is directly connected to an input node of the rectification circuit.

In a yet further embodiment, the rectification circuit comprises at least one resistor directly connected to electrical ground, at least one capacitor directly connected to electrical ground, at least one diode directly connected to electrical ground, and at least another diode directly connected to the input node of the rectification circuit.

In a still further embodiment, the semiconductor circuit further comprises:
  at least one first doped semiconductor region embedded in the bottom semiconductor layer and having a p-type doping, wherein a negative bias voltage that the rectification circuit generates from the RF signal is applied to the at least one first doped semiconductor region; and
  at least one second doped semiconductor region embedded in the bottom semiconductor layer and having an n-type doping, wherein a positive bias voltage that the rectification circuit generates from the RF signal is applied to the at least one second doped semiconductor region.

According to yet another aspect of the present invention, a design structure embodied in a machine readable medium for designing, manufacturing, or testing a design for a semiconductor structure is provided. The design structure comprises:
  a first data representing a radio frequency (RF) switch including at least one field effect transistor located on a semiconductor-on-insulator (SOI) substrate;
  a second date representing a radio frequency (RF) signal line for transmitting a radio frequency (RF) signal, wherein the RF signal line is connected to the RF switch;
  a third data representing a voltage divider connected between the RF signal line and electrical ground;
  a fourth data representing a rectification circuit connected to the voltage divider and generating at least one bias voltage from the RF signal that varies with a time constant greater than a period of the RF signal; and
  a fifth data representing at least one bias voltage feed line providing the at least one bias voltage to a bottom semiconductor layer of the SOI substrate.

In one embodiment, the design structure further comprises an additional data representing at least one conductive via resistively connected to the bottom semiconductor layer, wherein the at least one bias voltage is provided to the bottom semiconductor layer through the at least one conductive via.

In another embodiment, the design structure further comprises an additional data representing a power amplifier which is connected to, and provides the RF signal to, the RF signal line.

In even another embodiment, the design structure further comprises:
  a sixth data representing an antenna for transmitting the RF signal; and
  a seventh data representing another RF signal line connected to the RF switch and the antenna.

In yet another embodiment, the third data includes a eighth data representing a first set of at least one impedance element having a first impedance, a ninth data representing a second set of at least one impedance element having a second impedance, and a tenth data representing a serial connection between the first set of at least one impedance element and the second set of at least one impedance element, wherein one end of the first set of at least one impedance element is directly connected to the RF signal line, and wherein one end of the second set of at least one impedance element is directly connected to electrical ground, and wherein a common node between the first set and the second set is directly connected to an input node of the rectification circuit.

In still another embodiment, each of the eighth data and ninth data represents at least one of a resistor, a capacitor, and an inductor.

In a further embodiment, the fourth data includes an eleventh data representing at least one resistor directly connected to electrical ground, a twelfth data representing at least one capacitor directly connected to electrical ground, a thirteenth data representing at least one diode directly connected to electrical ground, and a fourteenth data representing at least another diode directly connected to the input node of the rectification circuit.

In a yet further embodiment, the design structure further comprises:
  a first additional data representing at least one first doped semiconductor region embedded in the bottom semiconductor layer and having a p-type doping;
  a second additional data representing a first electrical wiring structure for supplying a negative bias voltage that the rectification circuit generates from the RF signal to the at least one first doped semiconductor region;
  a third additional data representing at least one second doped semiconductor region embedded in the bottom semiconductor layer and having an n-type doping; and
  a fourth additional data representing a second electrical wiring structure for supplying a positive bias voltage that the rectification circuit generates from the RF signal to the at least one second doped semiconductor region.

BRIEF DESCRIPTION OF THE DRAWINGS

FIGS. 4A, 4B, and 4C are first, second, and third embodiments, respectively, of the voltage divider of the present invention.

DETAILED DESCRIPTION OF THE INVENTION

Figure 1:
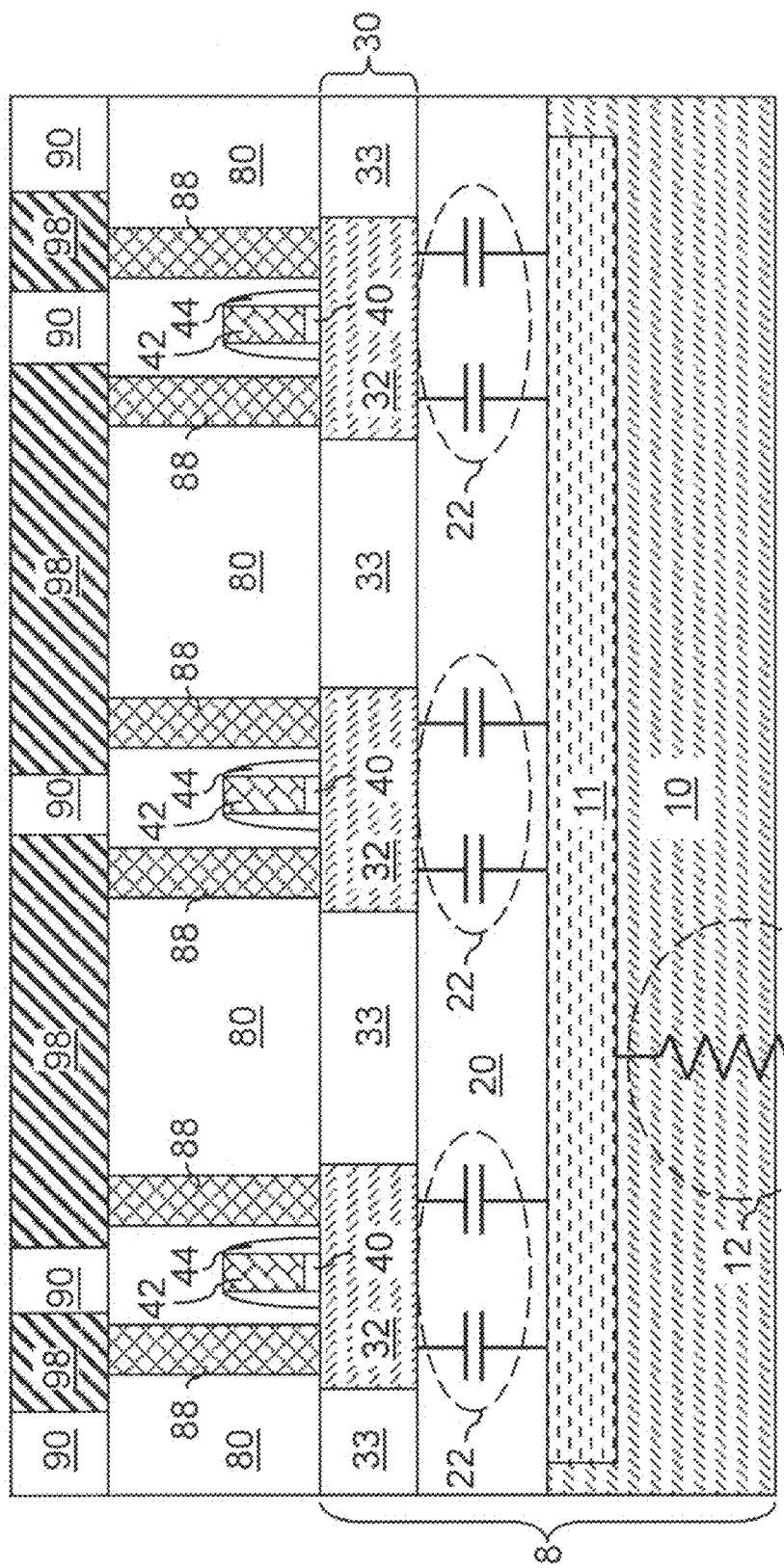
FIG. 1 is a vertical cross-sectional view of a prior art radio frequency switch structure.

As stated above, the present invention relates to a semiconductor structure including a radio frequency switch on a semiconductor-on-insulator (SOI) substrate and a design structure for the same, which are described herein with accompanying figures. The drawings are not necessarily drawn to scale.

As used herein, radio frequency (RF) denotes a frequency of electromagnetic wave within the range of 3 Hz to 300 GHz. Radio frequency corresponds to the frequency of electromagnetic wave that is used to produce and detect radio waves. Radio frequency includes very high frequency (VHF), ultra high frequency (UHF), super high frequency (SHF), and extremely high frequency (EHF).

As used herein, very high frequency (VHF) refers to a frequency in the range from 30 MHz to 300 MHz. VHF is used, among others, for frequency modulation (1M) broadcasting. Ultra high frequency (UHF) refers to a frequency in the range from 300 MHz to 3 GHz. UHF is used, among others, for mobile telephones, wireless networks, and microwave ovens. Super high frequency (SHF) refers to a frequency in the range from 3 GHz to 30 GHz. SHF is used, among others, for wireless networking, radar, and satellite links. Extremely high frequency (EHF) refers to a frequency in the range from 30 GHz to 300 GHz. EHF produces millimeter waves having a wavelength from 1 mm to 10 mm, and is used, among others, for data links and remote sensing.

The term "accumulation region" refers to a doped semiconductor region in which the majority charge carriers accumulate due to external voltage bias. A p-doped semiconductor region is in accumulation mode if excess holes, which are the majority charge carriers in the p-doped semiconductor region, accumulate in the p-doped semiconductor region by an external negative voltage so that the p-doped semiconductor region has a net positive charge. An n-doped semiconductor region is in accumulation mode if excess electrons, which are the majority charge carriers in the n-doped semiconductor region, accumulate in the n-doped semiconductor region by an external positive voltage so that the n-doped semiconductor region has a net negative charge.

The term "depletion region" refers to a doped semiconductor region from which the majority charge carriers are repelled due to external voltage bias while minority charge carriers do not accumulate so that majority charge carriers and minority charge carriers are depleted from the doped semiconductor region. A p-doped semiconductor region is in depletion mode if holes, which are the majority charge carriers in the p-doped semiconductor region, are depleted in the p-doped semiconductor region by a weak external positive voltage so that the p-doped semiconductor region has a net negative charge. An n-doped semiconductor region is in depletion mode if electrons, which are the majority charge carriers in the n-doped semiconductor region, are depleted in the n-doped semiconductor region by a weak external negative voltage so that the n-doped semiconductor region has a net positive charge.

The term "inversion region" refers to a doped semiconductor region in which minority charge carriers accumulate. Typically, an inversion region forms at a semiconductor surface in close proximity to a strong external voltage. A p-doped semiconductor region is in inversion mode if electrons, which are the minority charge carriers in the p-doped semiconductor region, accumulate in the p-doped semiconductor region by a strong external positive voltage so that the p-doped semiconductor region has a net negative charge. An n-doped semiconductor region is in inversion mode if holes, which are the minority charge carriers in the n-doped semiconductor region, accumulate in the n-doped semiconductor region by a strong external negative voltage so that the n-doped semiconductor region has a net positive charge.

Figure 2:
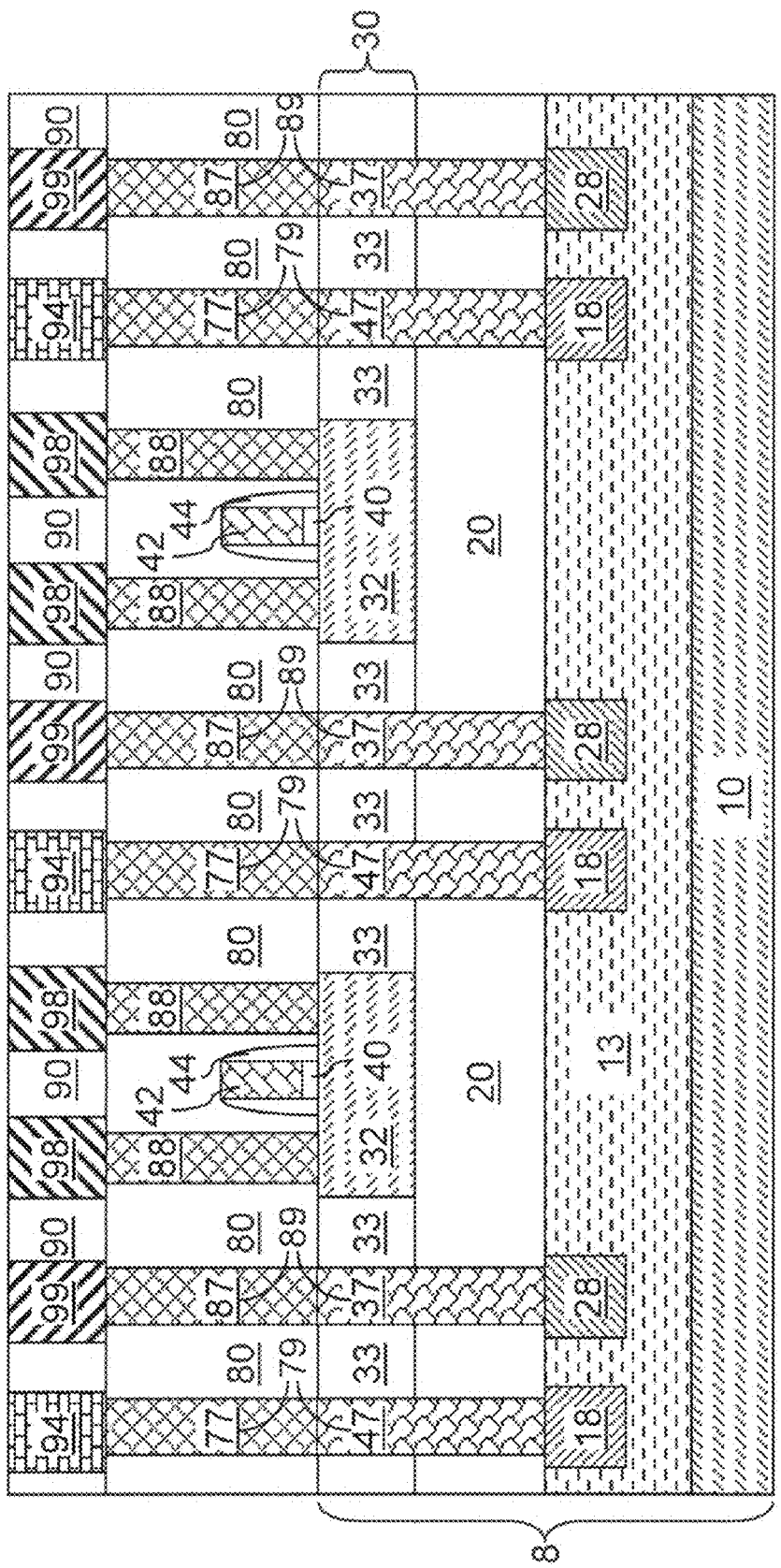
FIG. 2 is a vertical cross-sectional view of an exemplary semiconductor structure that may be employed as a physical implementation of a portion of the semiconductor circuit of the present invention.

Referring to FIG. 2, a vertical cross-sectional view of an exemplary semiconductor structure is shown during operation. The exemplary semiconductor structure may be employed as a physical implementation of a portion of the semiconductor circuit of the present invention. The exemplary semiconductor structure comprises a radio frequency (RF) switch, which includes at least one field effect transistor located directly on the at least one top semiconductor portion 32 of a top semiconductor layer 30 of a semiconductor-on-insulator substrate 8. Electrical wiring between the at least one field effect transistor is provided by third upper conductive vias 88 and third interconnect-level metal line 98. Each of the at least one field effect transistor includes a gate dielectric 40, a gate electrode 42, and a gate spacer 44. A source region (not shown) and a drain region (not shown) are present in each of the at least one top semiconductor portion 32 for each field effect transistor. The combination of a buried insulator layer 20, a shallow trench isolation structure 33, and a middle-of-line (MOL) dielectric layer 80 provide electrical isolation of the at least one field effect transistor, which is included in the RF switch, from other semiconductor devices and the bottom semiconductor layer 10. During operation, an induced charge layer 13 is formed within an upper portion of the bottom semiconductor layer 10. The induced charge layer 13 is an electrically charged portion of the bottom semiconductor layer 10.

Each of the bottom semiconductor layer 10 and the at least one top semiconductor portion 32 comprises a semiconductor material such as silicon, a silicon germanium alloy region, silicon, germanium, a silicon-germanium alloy region, a silicon carbon alloy region, a silicon-germanium-carbon alloy region, gallium arsenide, indium arsenide, indium gallium arsenide, indium phosphide, lead sulfide, other III-V compound semiconductor materials, and II-VI compound semiconductor materials. The semiconductor material of the bottom semiconductor layer 10 and the at least one top semiconductor portion 32 may be the same, or different. Typically, each of the bottom semiconductor layer 10 and the at least one top semiconductor portion 32 comprises a single crystalline semiconductor material. For example, the single crystalline semiconductor material may be silicon.

The bottom semiconductor layer 10 typically has a resistivity greater than 50 Ohms-cm, which includes, for example, lightly p-doped single crystalline silicon having p-type dopants at an atomic concentration less than about $2.0 \times 10^{14}/cm^3$ or n-doped single crystalline silicon having n-type dopants at an atomic concentration less than about $1.0 \times 10^{14}/cm^3$. Preferably, the bottom semiconductor layer 10 has a resistivity greater than 50 Ohms-cm, which includes, for example, p-doped single crystalline silicon having p-type dopants at an atomic concentration less than about $2.0 \times 10^{14}/cm^3$ or n-doped single crystalline silicon having n-type dopants at an atomic concentration less than about $1.0 \times 10^{14}/cm^3$. More preferably, the bottom semiconductor layer 10 has a resistivity greater than 1 kOhms-cm, which includes, for example, p-doped single crystalline silicon having p-type dopants at an atomic concentration less than about $1.0 \times 10^{13}/cm^3$ or n-doped single crystalline silicon having n-type dopants at an atomic concentration less than about $5.0 \times 10^{12}/cm^3$. The conductivity type of the bottom semiconductor layer 10 is herein referred to as a first conductivity type, which may be p-type or n-type.

The high resistivity of the bottom semiconductor layer 10 reduces eddy current, thereby reducing parasitic coupling of radio frequency signal generated or propagated in the top semiconductor layer 30 with the bottom semiconductor layer 10. While silicon is used herein to illustrate the required dopant level for each threshold resistivity value for the bottom semiconductor layer 10, target dopant concentrations for other semiconductor materials may be readily obtained since each type of semiconductor material has a well established relationship between the dopant concentration and the resistivity of the semiconductor material.

The thickness of the bottom semiconductor layer 10 is typically from about 400 microns to about 1,000 microns, and typically from about 500 microns to about 900 microns at this step. If the bottom semiconductor layer 10 is subsequently thinned, the thickness of the bottom semiconductor layer 10 may be from about 50 microns to about 800 microns.

The buried insulator layer 20 comprises a dielectric material such as silicon oxide, silicon nitride, silicon oxynitride, or a combination thereof. The thickness of the buried insulator layer 20 may be from about 50 nm to about 2000 nm, and typically from about 100 nm to about 500 nm, although lesser and greater thicknesses are also contemplated herein.

The shallow trench isolation structure 33 comprises a dielectric material such as silicon oxide, silicon nitride, silicon oxynitride, or a combination thereof. The shallow trench isolation structure 33 may be formed by forming at least one trench that extends to a top surface of the buried insulator layer 20 within the top semiconductor layer 30, filling the at least one trench with a dielectric material such as silicon oxide, silicon nitride, and/or silicon oxynitride, and removing the portion of the dielectric material from above the top surface of the top semiconductor layer 30 by planarization employing, for example, chemical mechanical planarization (CMP) and/or recess etch. In case the at least one trench is contiguous, the shallow trench isolation structure 33 may be of unitary construction, i.e., in one piece. The shallow trench isolation structure 33 may laterally abut and surround each of the at least one top semiconductor portion 32.

The thickness of the top semiconductor layer 30 may be from about 20 nm to about 200 nm, and typically from about 40 nm to about 100 nm, although lesser and greater thicknesses are also contemplated herein. The at least one top semiconductor portion 32 may be implanted with dopants of p-type or n-type. Typically, the dopant concentration of the at least one top semiconductor portion 32 is from about $1.0 \times 10^{15}/cm^3$ to about $1.0 \times 10^{18}/cm^3$, which corresponds to a dopant concentration for a body region of a field effect transistor, although lesser and greater concentrations are also contemplated herein.

Further, the exemplary semiconductor structure includes at least one first doped semiconductor region 18 and at least one second doped semiconductor region 28. The first doped semiconductor region 18 comprises the semiconductor material of the bottom semiconductor layer 10 and has a doping of a second conductivity type. The second conductivity type is the opposite of the first conductivity type. For example, if the first conductivity type is p-type, the second conductivity type is n-type, and vice versa. The second doped semiconductor region 28 comprises the semiconductor material of the bottom semiconductor layer 10 and has a doping of the first conductivity type.

The thicknesses of the at least one first doped semiconductor region 18 and the at least one second doped semiconductor region 28 may be from about 10 nm to about 600 nm, and typically from about 50 nm to about 300 nm, although lesser and greater thicknesses are also contemplated herein. The at least one first doped semiconductor region 18 is typically heavily doped to reduce the resistivity. Each of the at least one first doped semiconductor region 18 and the at least one second doped semiconductor region 28 may have a dopant concentration from about $1.0 \times 10^{19}/cm^3$ to abut $1.0 \times 10^{21}/cm^3$, although lesser and greater dopants concentrations are also contemplated herein.

The exemplary semiconductor structure further includes at least one first conductive via 79 and at least one first interconnect-level metal line 94 that provide electrical bias to the at least one first doped semiconductor region 18, at least one second conductive via 89 and at least one second interconnect-level metal line 99 that provide electrical bias to the at least one second doped semiconductor region 28, and third upper conductive vias 88 and third interconnect-level metal line 98. The at least one first interconnect-level metal line 94, the at least one second interconnect-level metal line 99, and the third interconnect-level metal line 98 are embedded in an interconnect level dielectric layer 90.

The at least one first conductive via 79 extends from the top surface of the MOL dielectric layer 80 to the top surface of the at least one first doped semiconductor region 18. Each of the at least one first conductive via 79 may be of integral construction, or may comprise one of at least one first lower conductive via 47 and one of the at least one first upper conductive via 77. The at least one second conductive via 89 extends from the top surface of the MOL dielectric layer 80 to the top surface of the at least one first doped semiconductor region 18. Each of the at least one second conductive via 89 may be of integral construction, or may comprise one of at least one second lower conductive via 37 and one of the at least one second upper conductive via 87.

The MOL dielectric layer 80 may comprise silicon oxide, silicon nitride, silicon oxynitride, an organo silicate glass (OSG), low-k chemical vapor deposition (CVD) oxide, a self-planarizing material such as a spin-on glass (SOG), and/or a spin-on low-k dielectric material such as SiLK™. Exemplary silicon oxides include undoped silicate glass (USG), borosilicate glass (BSG), phosphosilicate glass (PSG), fluorosilicate glass (FSG), borophosphosilicate glass (BPSG), or a combination thereof. The total thickness of the MOL dielectric layer 80, as measured from a top surface of the shallow trench isolation structure 33, may be from about 100 nm to about 10,000 nm, and typically from about 200 nm to about 5,000 nm. The top surface of the MOL dielectric layer 80 may be planarized, for example, by chemical mechanical planarization.

The dielectric material for the interconnect-level dielectric layer 90 may comprise any of the dielectric material that may be employed for the MOL dielectric layer 80 as described above. The thickness of the interconnect-level dielectric layer 90 may be from about 75 nm to about 1,000 nm, and typically from about 150 nm to about 500 nm, although lesser and greater thicknesses are also contemplated herein.

The at least one first interconnect-level metal line 94, the at least one second interconnect-level metal line 99, and the third interconnect-level metal line 98 may comprise, for example, Cu, Al, W, Ta, Ti, WN, TaN, TiN, or a combination thereof. The at least one first interconnect-level metal line 94, the at least one second interconnect-level metal line 99, and the third interconnect-level metal line 98 may comprise the same metallic material.

The at least one field effect transistor constitutes a radio frequency switch for a signal having a frequency from about 3 Hz to about 300 GHz. Particularly, the at least one field effect transistor may constitute a radio frequency switch that is capable of operating at VHF, UHF, SHF, and EHF.

At such high frequencies, capacitive coupling between the at least one field effect transistor and the bottom semiconductor layer 10 may become significant since the capacitive coupling increases linearly with frequency. The radio frequency signal in the at least one field effect transistor causes formation of an induced charge layer 13 in an upper portion of the bottom semiconductor layer 10. In the absence of electrical bias applied to the bottom semiconductor layer 10, the induced charge layer 13 is formed directly underneath the buried insulator layer 11, and includes positive charges or negative charges.

Specifically, the electrical charges in the induced charge layer 13 changes polarity at the signal frequency of the radio signal in the at least one field effect transistor in the absence of an electrical bias to the bottom semiconductor layer 10. When the voltage in the at least one field effect transistor is positive relative to the bottom semiconductor layer 10, electrons accumulate in the induced charge layer 13. When the voltage in the at least one field effect transistor is negative relative to the bottom semiconductor layer 10, holes accumulate in the induced charge layer 13. In the prior art, depending on the type of majority charge carriers in the bottom semiconductor layer 10, which is determined by the conductivity of the bottom semiconductor layer 10, the induced charge layer 13 may be in depletion mode having a net charge that is the opposite type of the conductivity of the bottom semiconductor layer 10, or may be in an inversion mode having a net charge that is the same type as the conductivity type of the bottom semiconductor layer 10.

Further, the thickness of the induced charge layer 13 changes in time at the signal frequency in the at least one field effect transistor. In other words, the frequency of the thickness change in the induced charge layer 13 is the radio frequency of the signal in the at least one field effect transistor.

According to the present invention, electrical bias is applied to the at least one second doped semiconductor region 28 to stabilize the property of the induced charge layer 13 during the operation of the at least one field effect transistor, which may function as an RF switch. The at least one second conductive via 89 provides an electrical path for applying the electrical bias to the at least one second doped semiconductor region 28 to stabilize the induced charge layer 13. The magnitude and polarity of the voltage bias applied to the at least one second doped semiconductor region 28 are selected to maintain the induced charge layer 13 in depletion mode, while preventing formation of any region in accumulation mode in the bottom semiconductor layer 10. In other words, the induced charge layer 13 is not in accumulation mode through the entirety of the cycle of the RF signal.

In case the bottom semiconductor layer 10 and the at least one second doped semiconductor region 28 have a p-type doping, the bias voltage applied to the at least one second doped semiconductor region 28 and the at least one first conductive via 89 is a constant, or slowly varying, negative voltage. Preferably, the magnitude of the negative voltage is about the same as, or greater than, the magnitude of maximum negative swing of the RF signal that is coupled into the top of the bottom semiconductor layer 10. In other words, the constant negative voltage is more negative than the coupled RF signal at any phase. In this case, the entirety of the induced charge layer 13 is charged with fixed negative charges. The induced charge layer 13 constitutes a depletion region, from which holes are depleted.

In case the bottom semiconductor layer 10 and the at least one second doped semiconductor region 28 have an n-type doping, the bias voltage applied to the at least one second doped semiconductor region 28 and the at least one first conductive via 89 is a constant, or slowly varying, positive voltage. Preferably, the magnitude of the positive voltage is about the same as, or greater than, the magnitude of maximum potential coupled into the top surface of the bottom semiconductor layer 10, during positive swings of the RF signal. In other words, the positive voltage is more positive than the potential in layer 10 from the RF signal at any phase. In this case, the entirety of the induced charge layer 13 is charged with positive charges. The induced charge layer 13 constitutes a depletion region, from which electrons are depleted.

The thickness of the induced charge layer 13 varies in time at the signal frequency of the RF signal in the at least one field effect transistor. However, the induced charge layer 13 is not in accumulation mode through the entirety of the cycle of the RF signal. Instead, the entirety of the induced charge layer 13 remains in depletion mode. The reduced change in the induced charge layer 13 due to the electrical bias reduces generation of harmonics by reducing non-linearities in the induced charge layer 13, which would be present without the at least one second doped semiconductor region 28 and the at least one conductive via 89 or the electrical bias applied thereto. Further, the electrical bias increases average thickness of the depletion region in the induced charge layer 13. Since no mobile charge is present in the depletion region, generation of eddy current is also reduced in the bottom semiconductor layer 10 and the induced charge layer 13 generated by the RF signal and embedded within the bottom semiconductor layer 10.

While the electrical charges in the depletion region is not mobile and does not contribute to eddy current, signal loss, and generation of harmonics during the operation of the at least one field effect transistor at the radio frequency, the minority charge carriers in an inversion region, if formed as in the prior art, are mobile, thereby causing eddy current, signal loss, and generation of harmonics. According to the present invention, electrical bias is applied to the at least one first doped semiconductor region 18 to drain the minority charge carriers as soon as they are thermally generated to prevent formation of an inversion region. The at least one first conductive via 79 provides an electrical path for applying the electrical bias to the at least one first doped semiconductor region 18. In case the bottom semiconductor layer 10 is p-doped, the minority charge carriers are electrons. In case the bottom semiconductor layer 10 is n-doped, the minority charge carriers are holes. The magnitude and polarity of the voltage bias applied to the at least one first doped semiconductor region 18 are selected to effectively drain the minority charge carriers immediately after thermal generation so that formation of an inversion region is prevented at all phase of the radio frequency signal in the at least one field effect transistor. Thus, the structure of the present invention eliminates any inversion region so that eddy current and harmonic generation due to mobile charges is minimized.

If the bottom semiconductor layer 10 has a p-type doping, the at least one first doped semiconductor region 18 has an n-type doping and the at least one second doped semiconductor region 28 has a p-type doping. A first bias voltage which is applied to the at least one first doped semiconductor region 18 and the at least one first conductive via 79 is a positive voltage, and a second bias voltage which is applied to the at least one second doped semiconductor region 28 and the at least one second conductive via 87 is a negative voltage. In one case, the magnitude of the positive voltage may be about the same as, or greater than, a magnitude of maximum positive swing of the RF signal induced in the bottom semiconductor layer 10. The magnitude of the negative voltage may be about the same as, or greater than the magnitude of maximum negative swing of the RF signal induced in the bottom semiconductor layer 10.

If the bottom semiconductor layer 10 has an n-type doping, the at least one first doped semiconductor region 18 has a p-type doping and the at least one second doped semiconductor region 28 has an n-type doping. A first bias voltage which applied to the at least one first doped semiconductor region 18 and the at least one first conductive via 79 is a constant negative voltage, and a second bias voltage applied to the at least one second doped semiconductor region 28 and the at least one second conductive via 87 is a constant positive voltage. In one case, the magnitude of the positive voltage may be about the same as, or greater than, a magnitude of maximum positive swing of the RF signal induced in the bottom semiconductor layer 10. The magnitude of the negative voltage may be about the same as, or greater than the magnitude of maximum negative swing of the RF signal induced in the bottom semiconductor layer 10.

Figure 3:
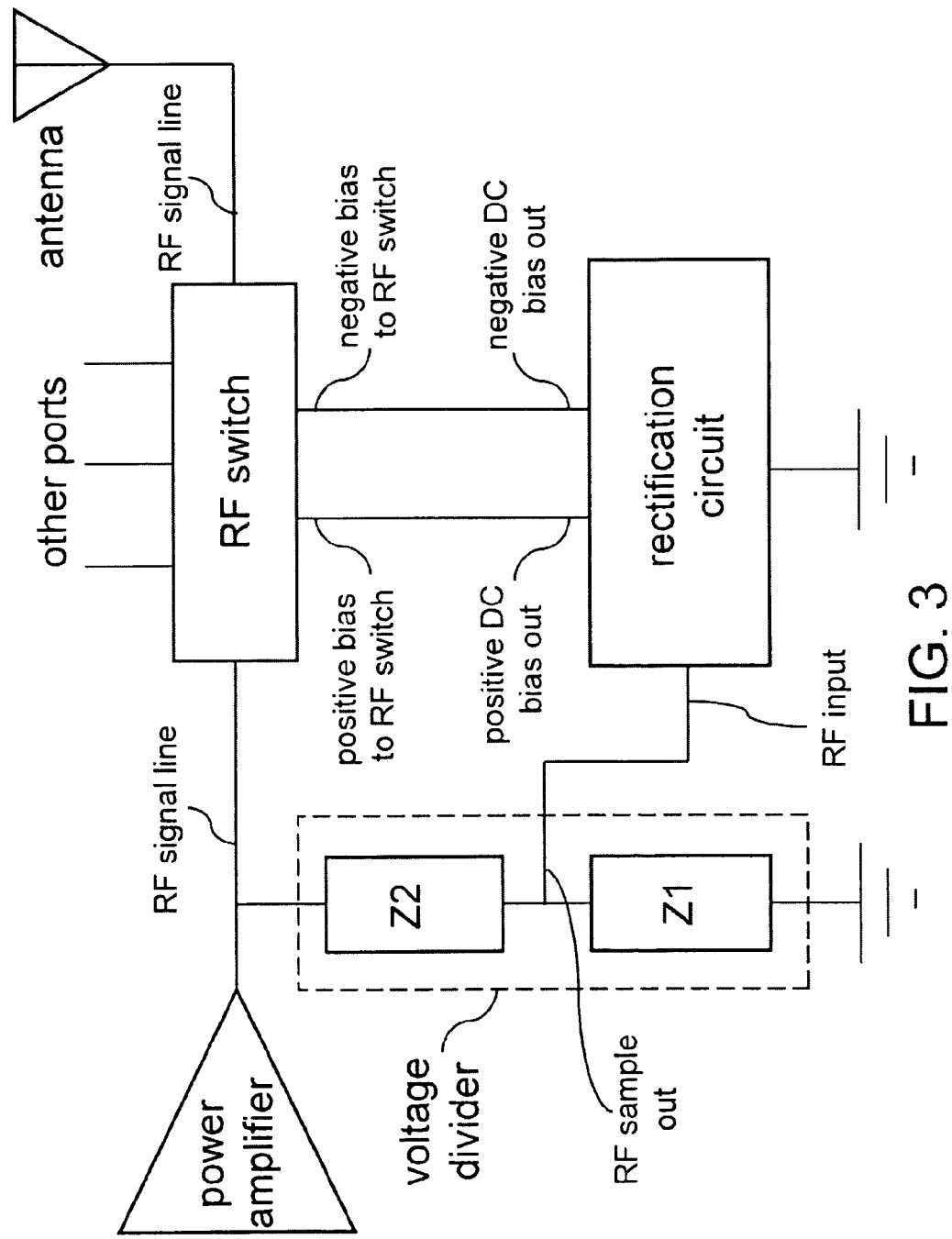
FIG. 3 is an exemplary semiconductor circuit of the present invention.

Referring to FIG. 3, a semiconductor circuit of the present invention is schematically illustrated. The semiconductor circuit includes a power amplifier, a first radio frequency (RF) signal line, a radio frequency switch, a second radio frequency signal line, an antenna, and a bias voltage generation circuit for generating at least one bias voltage from a radio frequency signal in the first RF signal line. The RF switch may comprise, for example, the exemplary semiconductor structure of FIG. 2 described above. The RF switch includes at least one field effect transistor and at least one wiring structure that contacts a bottom semiconductor layer of an SOI substrate on which the at least one field effect transistor is located.

The bias voltage generation circuit comprises a voltage divider connected between the first RF signal line and electrical ground and generating at least one bias voltage from the RF signal. The at least one bias voltage is supplied to a bottom semiconductor layer of the SOI substrate to provide performance of the RF switch by reducing secondary capacitive coupling, viz. by reducing mobile charge carriers in the bottom semiconductor layer by preventing formation of an accumulation region and/or an inversion region in the bottom semiconductor layer.

In case a system-on-chip (SoC) semiconductor chip is employed, the power amplifier, the RF switch, the voltage divider, and the rectification circuit are formed on the same SoC semiconductor chip. Optionally, the antenna and the second RF signal line may be integrated into the SoC semiconductor chip.

The power amplifier generates a radio frequency (RF) signal, which may have a frequency from about 3 Hz to about 300 GHz. Particularly, the power amplifier may generate an RF signal in the VHF, UHF, SHF, or EHF range. The higher the frequency of the RF signal, the greater the secondary capacitive coupling, and the greater the benefit of the present invention in mitigating the effects of the secondary capacitive coupling. Thus, the benefits of the present invention are greatest when the RF signal has a frequency from about 3 GHz to about 300 GHz. Extension of the present invention to a frequency exceeding 300 GHz is also explicitly contemplated herein.

The first RF signal line transfers the RF signal from the power amplifier to the RF switch. Typically, the first RF signal line is physically implemented as an interconnect level metal wire that connects the physical structure of the power amplifier and the physical structure of the RF switch, which includes the at least one field effect transistor.

The RF switch may be configured to electrically connect or electrically disconnect first RF signal line to the second RF signal line. Optionally, at least another input port may be provided in the RF switch to enable selection of an input from among the first RF signal line and the at least one other input port.

The signal selected by the RF switch is routed through the second RF signal line to the antenna, which generates electromagnetic waves at the frequency of the RF signal.

Alternately, the antenna may be employed to receive a radio frequency signal in the form of electromagnetic waves. In this case, the electromagnetic signal is captured by the antenna, transmitted to the RF switch through the second RF signal line, and routed to at least another output port provided in the RF switch. In case the RF switch comprises at least another port for receiving or transmitting an RF signal from the antenna, the second RF signal line may be electrically connected with node that is selecting from the RF signal line and the at least another port.

The amplitude of the RF signal may be from about 0.1 V to about 30 V. Typically, when the signal generated by the power amplifier is transmitted to the antenna through the first RF signal line, the RF switch, and the second RF signal line, the amplitude of the RF signal may be, for example, from about 3 V to about 12V. In some cases, signal reflection within the RF signal lines, the RF switch, and the antenna may increase the amplitude to about 30 V. Such high voltage induces mobile charge carriers in the buried insulator layer of the SOI substrate in which the at least one field effect transistor constituting the RF switch is located.

To provide at least one bias voltage to be applied to the bottom semiconductor layer of the SOI substrate, the voltage divider is connected to the first RF signal line. The voltage divider comprises a serial connection of a first set of at least one impedance element having a first impedance Z1 and a second set of at least one impedance element having a second impedance Z2. One end of the first set of at least one impedance element is directly connected to the first RF signal line, and one end of the second set of at least one impedance element is directly connected to electrical ground. A common node between the first set having the first impedance Z1 and the second set having the second impedance is directly connected to an input node of the rectification circuit.

Since the first set of at least one impedance element and the second set of at least one impedance element are in serial connection, the magnitude (or absolute value) of the total impedance, i.e., |Z1+Z2|, can be chosen to be greater than the magnitude of the second impedance Z2. The ratio of the magnitude of the second impedance Z2, i.e., |Z2| to the magnitude of a sum of the first impedance to the second impedance, i.e., |Z1+Z2| may be from about 0.01 to 1.0 at the frequency of the RF signal, and preferably from about 0.20 to 1 at the frequency of the RF signal. In the case of complex impedances, involving reactive components such as capacitors and/or inductors, the absolute value of the ratio of Z1 to (Z1+Z2), i.e. |Z1/(Z1+Z2)| represents the magnitude of the divider output voltage relative to the divider input voltage.

Referring to FIGS. 4A, 4B, and 4C, first, second, and third exemplary voltage dividers, respectively, of the present invention are shown. Each of the first set of impedance elements and the second set of impedance elements comprises at least one of a resistor, a capacitor, and an inductor. Each of the first set of impedance elements and the second set of impedance elements may comprise more than one element among a resistor, a capacitor, and an inductor.

In the first exemplary voltage divider of FIG. 4A, the first set of at least one impedance element consists of a first resistor having a first resistive impedance R1, and the second set of at least one impedance element consists of a second resistor having a second resistive impedance R2. In this case, the first impedance Z1 is the same as the first resistive impedance R1, and the second impedance Z2 is the same as the second resistive impedance R2.

In the second exemplary voltage divider of FIG. 4B, the first set of at least one impedance element consists of a first resistor having a first resistive impedance R1, and the second set of at least one impedance element includes a parallel connection of a second resistor having a second resistive impedance R2 and a capacitor having a capacitance C3, and impedance Z3 equal to the −j times inverse of the product of the radial frequency and the capacitance, where 'j' represents the principal square root of negative one. In this case, the first impedance Z1 is the same as the first resistive impedance R1, and the second impedance Z2 is given by the inverse of the sum of the inverse of the second resistive impedance R2 and the inverse of the third capacitive impedance Z3. It is recognized here that complex numbers are conventionally used to represent magnitudes and phase of voltages and electrical currents, an thus complex numbers are used to represent impedances of resistors, capacitors, and inductors.

In the third exemplary voltage divider of FIG. 4C, the first set of at least one impedance element consists of a first resistor having a first inductance L1, with impedance ZL equal to the j times the product of the radial frequency and the inductance, and the second set of at least one impedance element includes a parallel connection of a second resistor having a second resistive impedance R2 and a capacitor having a third capacitive impedance ZC, equal to −j times the inverse of the product of the capacitance C3 and the radial frequency. In this case, the first impedance Z1 is the same as the first inductive impedance ZL, and the second impedance Z2 is given by the inverse of the sum of the inverse of the second resistive impedance R2 and the inverse of the third capacitive impedance Z3.

Other variations of the voltage divider in which each of the first set of at least one impedance element and the second set of at least one impedance element any other combination of impedance elements are explicitly contemplated herein.

While the present invention is described for the configuration in which the voltage divider is directly connected between the first RF signal line and electrical ground, embodiments in which the voltage divider is directly connected between the second RF signal line and electrical ground are explicitly contemplated herein.

At an output node of the voltage divider, which is the common node between the first set of at least one impedance element and the second set of at least one element, another RF signal is generated derived from the RF signal in the first RF signal line. The RF signal at the output node of the voltage divider has a lesser magnitude than the RF signal in the first RF signal line and has the same frequency. The RF signal at the output node of the voltage divider is transmitted to an input node of the rectification circuit. The magnitude of the RF signal at the input node of the rectification circuit is the product of the magnitude of the RF signal at the first RF signal line and the magnitude (absolute value) of the ratio of the second impedance Z2 divided by the sum of the first impedance and the second impedance.

The rectification circuit generates at least one bias voltage that varies with a time constant greater than the period of the RF signal, i.e., the inverse of the frequency of the RF signal. Typically, the time constant is at least an order of magnitude greater than the period of the RF signal, and typically two or more orders of magnitude greater than the period of the RF signal. For example, in an application such as a cellular telephone, the RF signal may be at 900 MHz to over 2 Ghz, while the time constant for the rectification circuit may be on the order of 0.1 ms. For an RF signal having a frequency from about 3 GHz to about 300 GHz, the time constant of the at least one bias voltage may be from about 30 picoseconds to about 1 millisecond, and typically from about 300 picoseconds to about 10 microseconds. On the time scale of the period of the RF signal, therefore, the at least one bias voltage may be considered as a substantially constant voltage displaying a direct current (DC) behavior. In this sense, the at least one bias voltage is herein referred to as at least one direct current (DC) output voltage, of which the magnitude is modulated with the amplitude of the RF signal in the first RF signal line on a time scale that is at least an order of magnitude, and typically a few or several orders of magnitude, greater than the period of the RF signal.

In one embodiment, the at least one bias voltage may include a positive direct current (DC) output voltage having a magnitude that is less than the amplitude of the RF signal transmitted to the RF switch. In another embodiment, the at least one bias voltage may include a positive direct current (DC) output voltage having a magnitude that is equal to, or greater than, the amplitude of the RF signal transmitted to the RF switch. In other words, the positive bias voltage may have a magnitude greater than the magnitude of a maximum positive swing of the RF signal within a period of the RF signal in the RF switch. In yet another embodiment, the at least one bias voltage may include a negative direct current (DC) output voltage having a magnitude that is less than the amplitude of the RF signal transmitted to the RF switch. In still another embodiment, the at least one bias voltage may include a negative direct current (DC) output voltage having a magnitude that is equal to, or greater than, the amplitude of the RF signal transmitted to the RF switch. In other words, the negative bias voltage may have a magnitude greater than the magnitude of a maximum negative swing of the RF signal within a period of the RF signal in the RF switch.

Figure 5C:
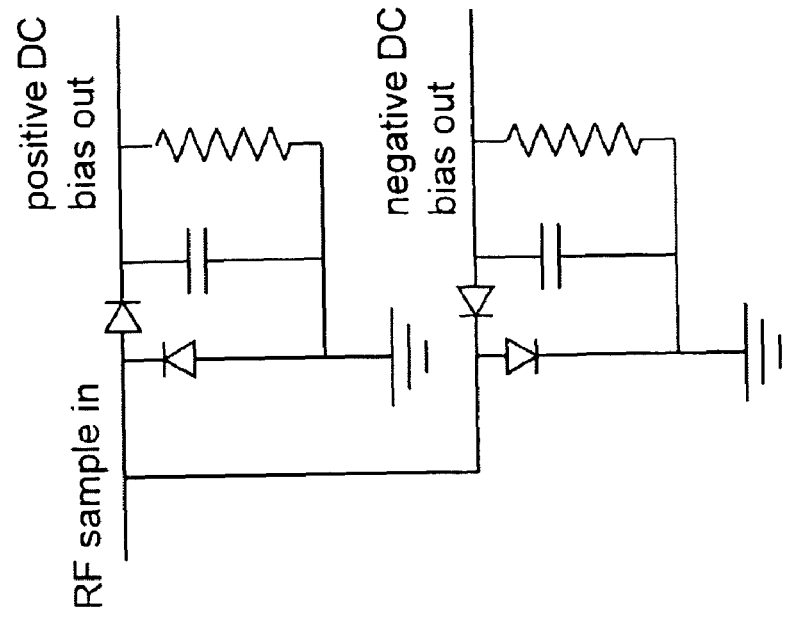
FIGS. 5A, 5B, and 5C are first, second, and third embodiment, respectively, of the rectification circuit of the present invention.
Figure 5A:
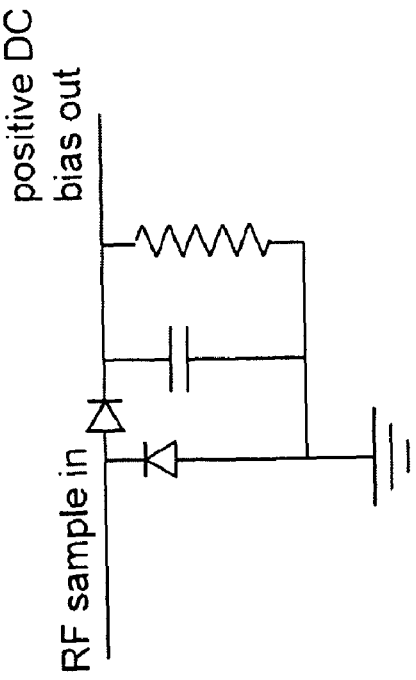
Figure 5B:
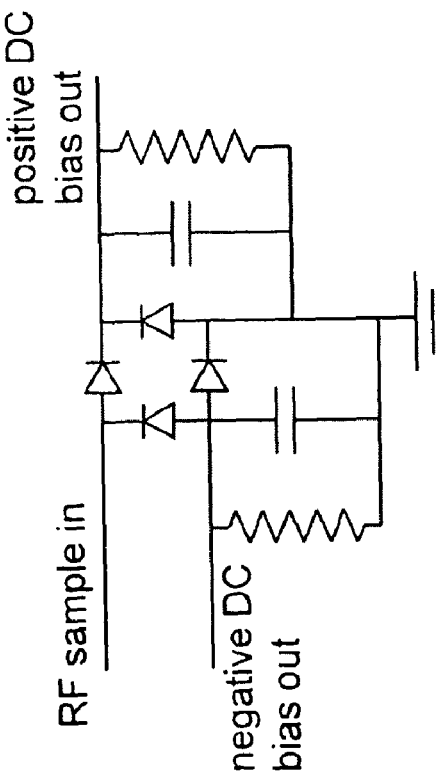

Referring to FIGS. 5A, 5B, and 5C, first, second, and third exemplary rectification circuit, respectively, of the present invention are shown. Each of the first through third exemplary rectification circuit includes at least one resistor directly connected to electrical ground, at least one capacitor directly connected to electrical ground, at least one diode directly connected to electrical ground, and at least another diode directly connected to the input node of the rectification circuit.

In the first exemplary rectification circuit of FIG. 5A, an RF signal is applied to the input node of the first exemplary rectification circuit at which two diodes are joined. The time dependent input voltage $V_i(t)$ at the input node the first exemplary rectification circuit may be given by:

$$V_i(t) = V_m(t) \times \sin(2\pi \times t) \times Z2/(Z1+Z2),$$

wherein $V_m(t)$ is the time-dependent magnitude of the RF signal in the first RF signal line and slowly changing over a time scale that is at least one order of magnitude greater than the period of the RF signal, f is the frequency of the RF signal, t is the time, Z1 is the first impedance, and Z2 is the second impedance. It is noted that Z1 and Z2 may be complex numbers. In this case, the time dependent output voltage $V_o(t)$ at the output node the first exemplary rectification circuit is a positive direct current (DC) voltage that is modulated by $V_m(t)$, i.e., the time-dependent magnitude of the RF signal, and is given by:

$$V_o(t) \cong 2 \times V_m(t) \times |Z2/(Z1+Z2)|,$$

wherein $|Z2/(Z1+Z2)|$ is the magnitude of $Z2/(Z1+Z2)$. The time dependent output voltage $V_o(t)$ does not include any radio frequency component. In case $|Z2/(Z1+Z2)|$ is from about 0.1 to 1, the time dependent output voltage $V_o(t)$ may have a magnitude equal to or greater than $V_m(t)$, i.e., the time-dependent magnitude of the RF signal in the first RF signal line.

In the second exemplary rectification circuit of FIG. 5B, an RF signal is applied to the input node of the second exemplary rectification circuit at which two diodes are joined. The time dependent input voltage $V_i(t)$ at the input node the second exemplary rectification circuit may be given by:

$$V_i(t) = V_m(t) \times \sin(2\pi f \times t) \times Z2/(Z1+Z2),$$

as in the first exemplary rectification circuit. A first time dependent positive output voltage $V1_o(t)$ at a first output node the second exemplary rectification circuit is a positive direct current (DC) voltage that is modulated by $V_m(t)$, i.e., the time-dependent magnitude of the RF signal, and is given by:

$$V1_o(t) \cong V_m(t) \times |Z2/(Z1+Z2)|,$$

wherein $|Z2/(Z1+Z2)|$ is the magnitude of $Z2/(Z1+Z2)$. The first time dependent output voltage $V1_o(t)$ does not include any radio frequency component. The first time dependent output voltage $V_o(t)$ has a magnitude lesser than $V_m(t)$, i.e., the time-dependent magnitude of the RF signal in the first RF signal line. A second time dependent positive output voltage $V2_o(t)$ at a second output node the second exemplary rectification circuit is a negative direct current (DC) voltage that is modulated by $V_m(t)$, i.e., the time-dependent magnitude of the RF signal, and is given by:

$$V2_o(t) \cong -V_m(t) \times |Z2/(Z1+Z2)|,$$

wherein $|Z2/(Z1+Z2)|$ is the magnitude of $Z2/(Z1+Z2)$. The second time dependent output voltage $V2_o(t)$ does not include any radio frequency component. The second time dependent output voltage $V_o(t)$ has a magnitude lesser than $V_m(t)$, i.e., the time-dependent magnitude of the RF signal in the first RF signal line.

In the third exemplary rectification circuit of FIG. 5C, an RF signal is applied to the input node of the third exemplary rectification circuit which is a node at which two pairs of two adjoined diodes are joined. The time dependent input voltage $V_i(t)$ at the input node the third exemplary rectification circuit may be given by:

$$V_i(t) = V_m(t) \times \sin(2\pi f \times t) \times Z2/(Z1+Z2),$$

as in the first exemplary rectification circuit. A first time dependent positive output voltage $V1_o(t)$ at a first output node the third exemplary rectification circuit is a positive direct current (DC) voltage that is modulated by $V_m(t)$, i.e., the time-dependent magnitude of the RF signal, and is given by:

$$V1_o(t) \cong 2 \times V_m(t) \times |Z2/(Z1+Z2)|,$$

wherein $|Z2/(Z1+Z2)|$ is the magnitude of $Z2/(Z1+Z2)$. The first time dependent output voltage $V1_o(t)$ does not include any radio frequency component. In case $|Z2/(Z1+Z2)|$ is from about 0.5 to 1, the first time dependent output voltage $V1_o(t)$ may have a magnitude equal to or greater than $V_m(t)$, i.e., the time-dependent magnitude of the RF signal in the first RF signal line. A second time dependent positive output voltage $V2_o(t)$ at a second output node the third exemplary rectification circuit is a negative direct current (DC) voltage that is modulated by $V_m(t)$, i.e., the time-dependent magnitude of the RF signal, and is given by:

$$V2_o(t) \cong -2 \times V_m(t) \times |Z2/(Z1+Z2)|,$$

wherein $|Z2/(Z1+Z2)|$ is the magnitude of $Z2/(Z1+Z2)$. The second time dependent output voltage $V2_o(t)$ does not include any radio frequency component. In case $|Z2/(Z1+Z2)|$ is from about 0.5 to 1, the second time dependent output voltage $V2_o(t)$ may have a magnitude equal to or greater than $V_m(t)$, i.e., the time-dependent magnitude of the RF signal in the first RF signal line.

In general, other rectification circuits may be employed instead of the first, second, or third exemplary rectification circuit. Rectification circuits that provide a direct current output voltage that is more than twice the magnitude of the input RF signal provided to the input node of the rectification circuits may be employed as well, which is particularly useful if $|Z2/(Z1+Z2)|$ is less than 0.5.

Referring back to FIG. 3, the at least one output bias voltage is applied to the RF switch through at least one bias voltage feed line, which provides the at least one bias voltage to the bottom semiconductor layer of the SOI substrate. The at least one bias voltage feed line may comprise a first electrical wiring structure for supplying a negative bias voltage that the rectification circuit generates from the RF signal to the at least one first doped semiconductor region in the bottom semiconductor layer. The at least one bias voltage feed line may further comprise a second electrical wiring structure for supplying a positive bias voltage that the rectification circuit generates from the RF signal to the at least one second doped semiconductor region.

The at least one first doped semiconductor region may be, for example, the at least one first doped semiconductor region 18 in FIG. 2. The at least one second doped semiconductor region may be, for example, the at least one second doped semiconductor region 28 in FIG. 2. The first electrical wiring structure may include, for example, the at least one first conductive via 79 resistively connected to the at least one first doped semiconductor region 18 and the at least one first interconnect-level metal line 94 vertically abutting the at least one first conductive via 79 as shown in FIG. 2. The second electrical wiring structure may include, for example, the at least one second conductive via 89 resistively connected to the at least one second doped semiconductor region 28 and the at least one second interconnect-level metal line 99 vertically abutting the at least one second conductive via 89 as shown in FIG. 2. Each of the at least one bias voltage is provided to the bottom semiconductor layer 10 through one of the at least one conductive vias (79, 89). For example, the negative bias voltage that the rectification circuit generates from the RF signal is supplied to the at least one first doped semiconductor region 18 through the at least one first conductive via 79, and the positive bias voltage that the rectification circuit generates from the RF signal is supplied to the at least one second doped semiconductor region 28 through the at least one second conductive via 89. The at least one first doped semiconductor region 18 is embedded in the bottom semiconductor layer 10 and has a p-type doping and is at least partially below the at least on field effect transistor. The at least one second doped semiconductor region 28 is embedded in the bottom semiconductor layer 10 and has an n-type doping. Generation of mobile charges in the bottom semiconductor layer 10 is suppressed in the manner described above by using the positive and negative bias voltages generated from the rectification circuit.

Embodiment in which the at least one output bias voltage is applied to other portions of the RF switch, e.g., any structure located in or above a top semiconductor portion within the top semiconductor layer of the SOI substrate, to reduce secondary capacitive coupling or otherwise to improve performance of the RF switch are explicitly contemplated herein.

Figure 6:
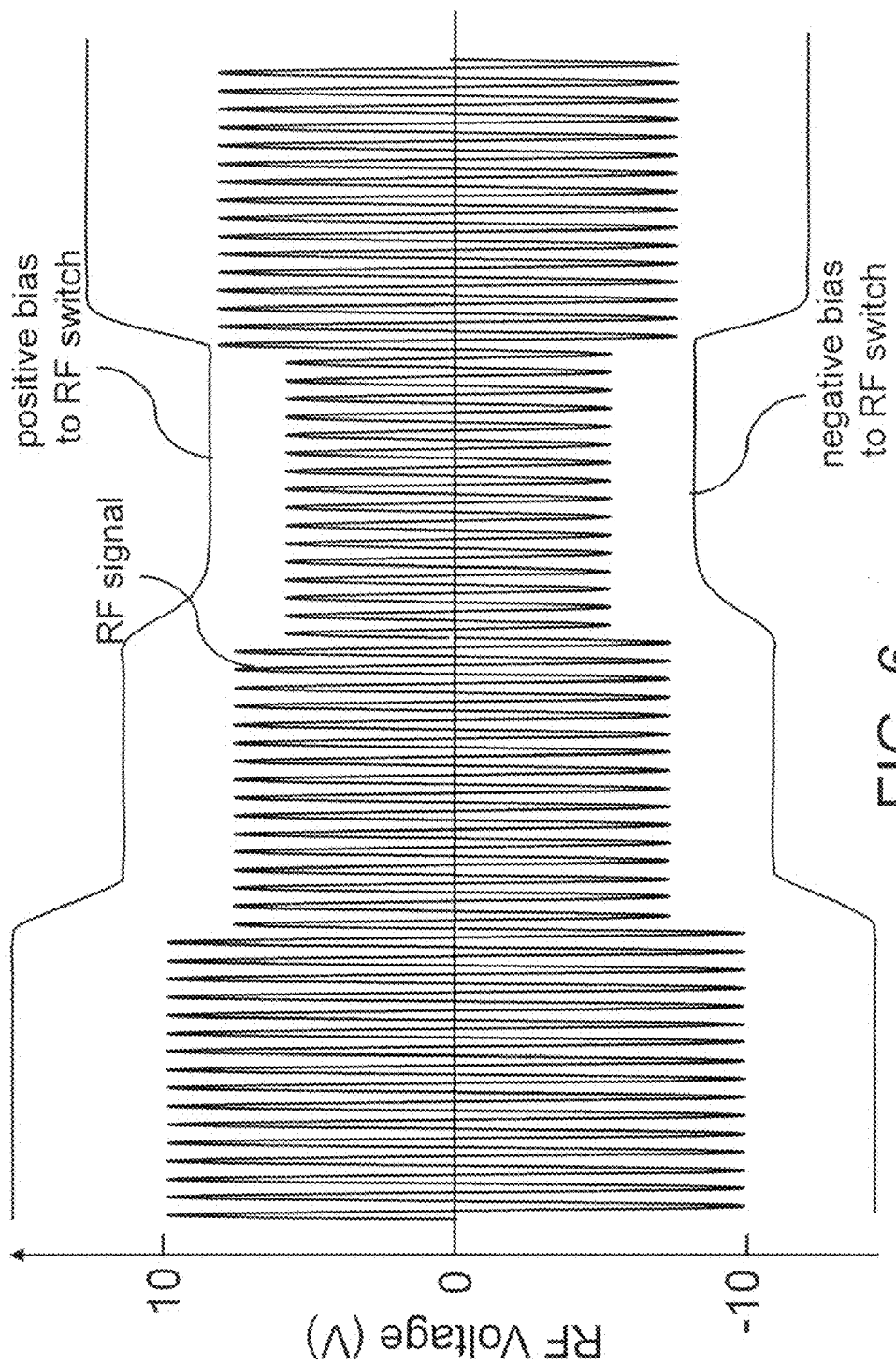
FIG. 6 is graph showing a time-dependent plot of a radio frequency (RF) signal, a positive bias voltage supplied to a radio frequency (RF) switch, and a negative bias voltage supplied to the RF switch.

Referring to FIG. 6, the magnitude of the at least one bias voltage is automatically adjusted with any modulation in the time-dependent magnitude of the RF signal, $V_m(t)$. In other words, the magnitude of each of the at least one bias voltage generated from the rectification circuit is automatically adjusted to the magnitude of the RF signal. This auto-adjustment feature has the advantage of optimizing the magnitude of the at least one bias voltage so that excessive biasing is prevented and an optimal level of the at least one bias voltage is provided to the RF switch at all times.

Figure 7:
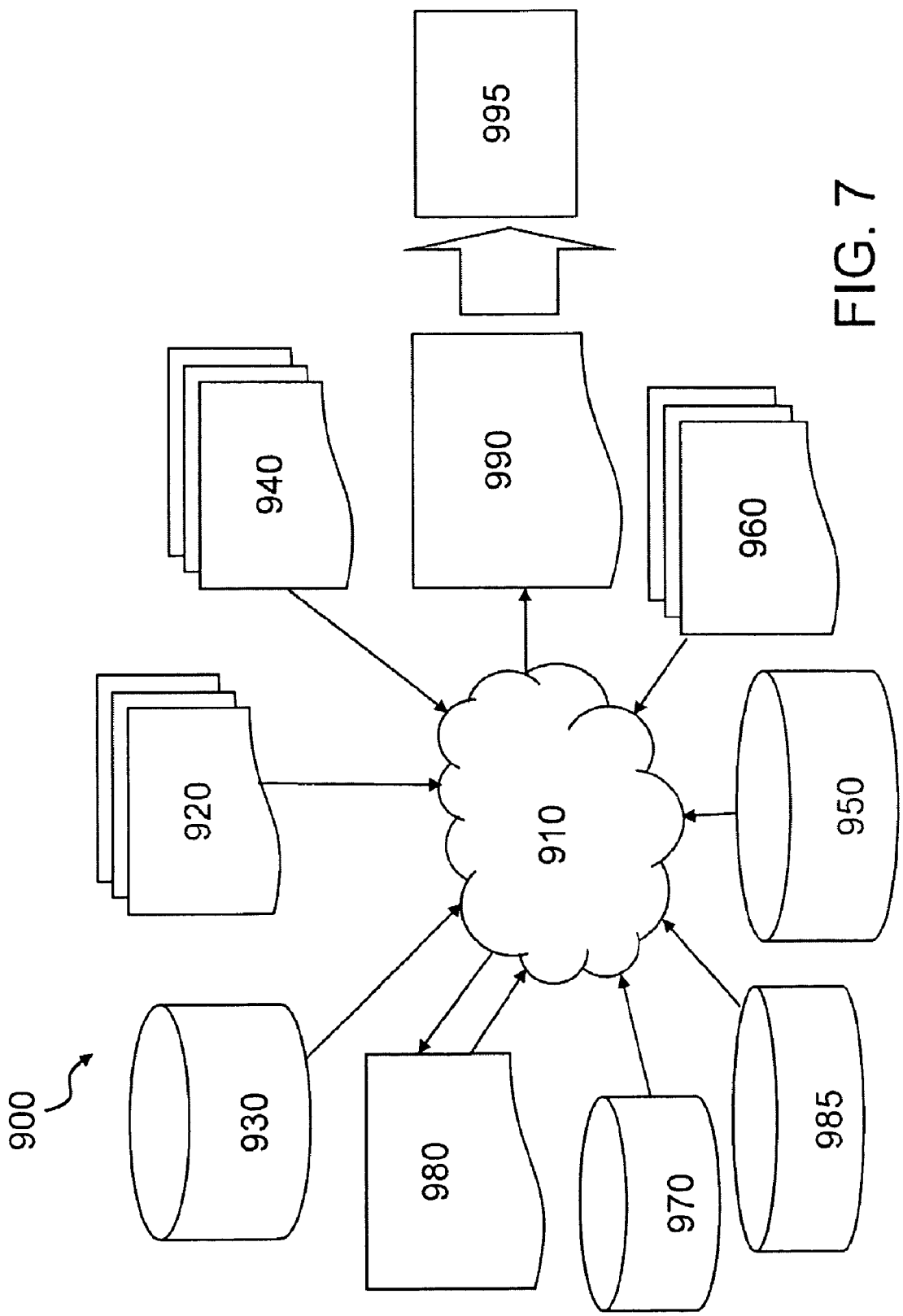
FIG. 7 is a flow diagram of a design process used in semiconductor design and manufacture of the semiconductor structures according to the present invention.

FIG. 7 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIGS. 2, 3, 4A, 4B, 4C, 5A, 5B, 5C, and 6. The design structures processes and/or generated by design flow 900 may be encoded on machine-readable transmission or storage media to include data and/or instructions that, when executed or otherwise processes on a data processing system, generate a logically, structurally, mechanically, or otherwise functionally equivalent representation of hardware components, circuits, devices, or systems. Design flow 900 may vary depending on the type of representation being designed. For example, a design flow for building an application specific integrated circuit (ASIC) may differ from a design flow 900 for designing a standard component or from a design flow 900 for instantiating the design into a programmable array, for example, a programmable gate array (PGA) or a field programmable gate array (FPGA) offered by Altera® Inc. or Xilinx® Inc.

FIG. 7 illustrates multiple such design structures including an input design structure 920 that is preferably processed by design process 910. Design structure 920 may be a logical simulation design structure generated and processed by design process 910 to produce a logically equivalent functional representation of a hardware device. Design structure 920 may also, or alternately, comprise data and/or program instructions that, when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 2, 3, 4A, 4B, 4C, 5A, 5B, 5C, and 6. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 2, 3, 4A, 4B, 4C, 5A, 5B, 5C, and 6 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 2, 3, 4A, 4B, 4C, 5A, 5B, 5C, and 6. In one embodiment, design structure 990 may comprise a compiled, executable HDL simulation model that functionally simulates the devices shown in FIGS. 2, 3, 4A, 4B, 4C, 5A, 5B, 5C, and 6.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 2, 3, 4A, 4B, 4C, 5A, 5B, 5C, and 6. Design structure 990 may then proceed to a stage 995 where, for example, design structure 990: proceeds to tape-out, is released to manufacturing, is released to a mask house, is sent to another design house, is sent back to the customer, etc.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of operating a semiconductor circuit comprising:
   providing a semiconductor circuit including:
      a radio frequency (RF) switch including at least one field effect transistor located on a semiconductor-on-insulator (SOI) substrate;
      a radio frequency (RF) signal line for transmitting a radio frequency (RF) signal, wherein said RF signal line is connected to said RF switch; and
      a circuitry that generates, from said RF signal, at least one bias voltage having a time-dependent modulated magnitude that is proportional to a time-dependent magnitude of said RF signal, and changes over a time scale that is at least one order of magnitude greater than a period of said RF signal; and
   supplying said at least one bias voltage to a bottom semiconductor layer underlying a buried insulator layer of said SOI substrate.

2. The method of claim 1, wherein said semiconductor circuit further comprises at least one bias voltage feed line that supplies said at least one bias voltage to said bottom semiconductor layer of said SOI substrate.

3. The method of claim 1, wherein said semiconductor circuit further comprises at least one conductive via resistively connected to said bottom semiconductor layer, and wherein said at least one bias voltage is provided to said bottom semiconductor layer through said at least one conductive via.

4. The method of claim 1, wherein said at least one bias voltage includes a positive bias voltage having a magnitude greater than a magnitude of a maximum positive swing of said RF signal within a period of said RF signal, and wherein said at least one bias voltage includes a negative bias voltage having a magnitude greater than a magnitude of a maximum negative swing of said RF signal within a period of said RF signal.

5. The method of claim 1, wherein said semiconductor circuit further comprises a power amplifier which is connected to, and provides said RF signal to, said RF signal line.

6. The method of claim 1, wherein said at least one bias voltage is generated by a voltage divider that comprises a serial connection of a first set of at least one impedance element having a first impedance and a second set of at least one impedance element having a second impedance, wherein one end of said first set of at least one impedance element is directly connected to said RF signal line, and wherein one end of said second set of at least one impedance element is directly connected to electrical ground.

7. The method of claim 1, wherein said semiconductor circuit further comprises:
   at least one first doped semiconductor region embedded in said bottom semiconductor layer and having a p-type doping; and
   at least one second doped semiconductor region embedded in said bottom semiconductor layer and having an n-type doping.

8. The method of claim 7, wherein said semiconductor circuit further comprises a rectification circuit, and said method further comprises:
   applying a negative bias voltage that said rectification circuit generates from said RF signal to said at least one first doped semiconductor region; and
   applying a positive bias voltage that said rectification circuit generates from said RF signal is applied to said at least one second doped semiconductor region.

9. The method of claim 8, further comprising:
   suppressing formation of an accumulation region in which majority charge carriers accumulate in said bottom semiconductor layer with one of said negative bias voltage and said positive bias voltage; and
   suppressing formation of an inversion region in which minority charge carriers accumulate in said bottom semiconductor layer with the other of said negative bias voltage and said positive bias voltage.

10. A semiconductor circuit comprising:
    a radio frequency (RF) switch including at least one field effect transistor located on a semiconductor-on-insulator (SOI) substrate;
    a radio frequency (RF) signal line for transmitting a radio frequency (RF) signal, wherein said RF signal line is connected to said RF switch;
    a voltage divider connected between said RF signal line and electrical ground;
    a rectification circuit connected to said voltage divider and generating, from said RF signal, at least one bias voltage having a time-dependent modulated magnitude that is proportional to a time-dependent magnitude of said RF signal, and changes over a time scale that is at least one order of magnitude greater than a period of said RF signal; and
    at least one bias voltage feed line providing said at least one bias voltage to a bottom semiconductor layer underlying a buried insulator layer of said SOI substrate.

11. The semiconductor circuit of claim 10, further comprising at least one conductive via resistively connected to said bottom semiconductor layer, wherein said at least one bias voltage is provided to said bottom semiconductor layer through said at least one conductive via.

12. The semiconductor circuit of claim 10, wherein said at least one bias voltage includes a positive bias voltage having a magnitude greater than a magnitude of a maximum positive swing of said RF signal within a period of said RF signal.

13. The semiconductor circuit of claim 10, wherein said at least one bias voltage includes a negative bias voltage having a magnitude greater than a magnitude of a maximum negative swing of said RF signal within a period of said RF signal.

14. The semiconductor circuit of claim 10, wherein said at least one bias voltage includes a positive bias voltage having a magnitude greater than a magnitude of a maximum positive swing of said RF signal within a period of said RF signal, and wherein said at least one bias voltage includes a negative bias voltage having a magnitude greater than a magnitude of a maximum negative swing of said RF signal within a period of said RF signal.

15. The semiconductor circuit of claim 10, further comprising a power amplifier which is connected to, and provides said RF signal to, said RF signal line.

16. The semiconductor circuit of claim 10, wherein said voltage divider comprises a serial connection of a first set of at least one impedance element having a first impedance and a second set of at least one impedance element having a second impedance, wherein one end of said first set of at least one impedance element is directly connected to said RF signal line, and wherein one end of said second set of at least one impedance element is directly connected to electrical ground, and wherein a common node between said first set and said second set is directly connected to an input node of said rectification circuit.

17. The semiconductor circuit of claim 16, wherein each of said first set of at least one impedance element and said second set of at least one impedance element comprises at least one of a resistor, a capacitor, and an inductor.

18. The semiconductor circuit of claim 16, wherein a ratio between a magnitude of a sum of said first impedance and said second impedance to a magnitude of said second impedance is from about 0.5 to 1.0 at a frequency of said RF signal.

19. The semiconductor circuit of claim 16, wherein said rectification circuit comprises at least one resistor directly connected to electrical ground, at least one capacitor directly connected to electrical ground, at least one diode directly connected to electrical ground, and at least another diode directly connected to said input node of said rectification circuit.

20. The semiconductor circuit of claim 10, further comprising:
    at least one first doped semiconductor region embedded in said bottom semiconductor layer and having a p-type doping, wherein a negative bias voltage that said rectification circuit generates from said RF signal is applied to said at least one first doped semiconductor region; and
    at least one second doped semiconductor region embedded in said bottom semiconductor layer and having an n-type doping, wherein a positive bias voltage that said rectification circuit generates from said RF signal is applied to said at least one second doped semiconductor region.

21. A machine readable medium embodying a design structure for designing, manufacturing, or testing a design for a semiconductor structure, said design structure comprising:
    a first data representing a radio frequency (RF) switch including at least one field effect transistor located on a semiconductor-on-insulator (SOI) substrate;
    a second data representing a radio frequency (RF) signal line for transmitting a radio frequency (RF) signal, wherein said RF signal line is connected to said RF switch;
    a third data representing a voltage divider connected between said RF signal line and electrical ground;
    a fourth data representing a rectification circuit connected to said voltage divider and generating, from said RF signal, at least one bias voltage having a time-dependent modulated magnitude that is proportional to a time-dependent magnitude of said RF signal, and changes over a time scale that is at least one order of magnitude greater than a period of said RF signal; and
    a fifth data representing at least one bias voltage feed line providing said at least one bias voltage to a bottom semiconductor layer underlying a buried insulator layer of said SOI substrate.

22. The machine readable medium of claim 21, further comprising an additional data representing at least one conductive via resistively connected to said bottom semiconductor layer, wherein said at least one bias voltage is provided to said bottom semiconductor layer through said at least one conductive via.

23. The machine readable medium of claim 21, further comprising:
   a sixth data representing an antenna for transmitting said RF signal; and
   a seventh data representing another RF signal line connected to said RF switch and said antenna.

24. The machine readable medium of claim 21, wherein said third data includes a eighth data representing a first set of at least one impedance element having a first impedance, a ninth data representing a second set of at least one impedance element having a second impedance, and a tenth data representing a serial connection between said first set of at least one impedance element and said second set of at least one impedance element, wherein one end of said first set of at least one impedance element is directly connected to said RF signal line, and wherein one end of said second set of at least one impedance element is directly connected to electrical ground, and wherein a common node between said first set and said second set is directly connected to an input node of said rectification circuit.

25. The machine readable medium of claim 21, further comprising:
   a first additional data representing at least one first doped semiconductor region embedded in said bottom semiconductor layer and having a p-type doping;
   a second additional data representing a first electrical wiring structure for supplying a negative bias voltage that said rectification circuit generates from said RF signal to said at least one first doped semiconductor region;
   a third additional data representing at least one second doped semiconductor region embedded in said bottom semiconductor layer and having an n-type doping; and
   a fourth additional data representing a second electrical wiring structure for supplying a positive bias voltage that said rectification circuit generates from said RF signal to said at least one second doped semiconductor region.

* * * * *